United States Patent
Srinivasan et al.

(10) Patent No.: US 10,223,485 B2
(45) Date of Patent: Mar. 5, 2019

(54) RELIABILITY VERIFICATION BASED ON COMBINING VOLTAGE PROPAGATION WITH SIMULATION

(71) Applicant: Mentor Graphics Corporation, Wilsonville, OR (US)

(72) Inventors: Sridhar Srinivasan, Tualatin, OR (US); Mark E. Hofmann, Portland, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 60 days.

(21) Appl. No.: 15/420,448

(22) Filed: Jan. 31, 2017

(65) Prior Publication Data
US 2018/0218100 A1   Aug. 2, 2018

(51) Int. Cl.
*G06F 17/50* (2006.01)

(52) U.S. Cl.
CPC ........ *G06F 17/5036* (2013.01); *G06F 17/504* (2013.01)

(58) Field of Classification Search
CPC ............ G06F 17/5009; G06F 17/5036; G06F 17/5045; G06F 11/3466; G06F 17/5022
USPC ................................................ 716/106–107
See application file for complete search history.

(56) References Cited

U.S. PATENT DOCUMENTS

| | | | | |
|---|---|---|---|---|
| 9,129,078 B1* | 9/2015 | Keller | ............... | G06F 17/5036 |
| 2010/0169064 A1* | 7/2010 | Boselli | ............... | G06F 17/5036 703/14 |
| 2010/0269075 A1* | 10/2010 | Tonti | ............... | G06F 17/5009 716/132 |

* cited by examiner

*Primary Examiner* — Paul Dinh

(57) ABSTRACT

Aspects of the disclosed technology relate to techniques of voltage-based reliability verification. Voltage values on nets of a circuit design are determined based on a combination of propagating voltage values across components of the circuit design and simulating one or more subcircuits. The one or more subcircuits are identified based on circuit topology recognition. The determined voltage values are analyzed to detect problems in the circuit design.

18 Claims, 10 Drawing Sheets

Flow chart
600

RELIABILITY VERIFICATION BASED ON COMBINING VOLTAGE PROPAGATION WITH SIMULATION

FIELD OF THE DISCLOSED TECHNOLOGY

The present disclosed technology relates to integrated circuit design and process technologies. Various implementations of the disclosed technology may be particularly useful for reliability verification of a circuit design.

BACKGROUND OF THE DISCLOSED TECHNOLOGY

Many power-efficient circuit designs today have multiple voltage domains. Device electrical overstress occurs when a low-voltage device is driven by a high-voltage power rail, signal, or bulk connection with the potential to cause long-term or permanent damage (usually in the form of oxide breakdown). This damage results in circuit degradation or failure over time. Conversely, when insufficient voltage is applied to a high-voltage device or the device is driven by a low-voltage net, the device may not switch, or may switch slowly, again degrading circuit performance.

Thin-oxide transistors, used extensively at advanced nodes, are less robust against electrical failure and impose new electrical overstress verification challenges. Thinner oxide generally allows for the use of lower voltage and provides less power. When power domain design errors occur, effects such as negative bias temperature instability (NBTI) can lead to the threshold voltage of the PMOS transistors increasing over time, resulting in reduced switching speeds for logic gates, and hot carrier injection (HCI) issues, altering the threshold voltage of NMOS devices over time. Soft breakdown (SBD), as a time-dependent failure mechanism, also contributes to the degradation effects of gate oxide breakdown.

Electrical overstress is an important concern for both analog and digital designers, due to the variety of power conditions commonly used in all designs, such as multiple power domains, standby/wake-up/low power/power-down conditions (in which there is no bias current, but the battery is present), and the presence of high-voltage signals. Understanding device pin voltages in all modes of operation is thus critical for detecting potential electrical overstress issues. The ability to identify device breakdown, recognize reverse breakdown issues in high-voltage areas, and detect maximum voltage across gate oxides are all part of a robust electrical overstress detection strategy.

Verifying device operating voltage conditions in voltage-controlled designs, however, is very complicated. Achieving this with exhaustive dynamic simulation is simply not practical at the full chip level due to the turnaround time involved. If the design is a large system-on-chip design, it may not even be possible to simulate it in its entirety. Many design teams employ SPICE (Simulation Program with Integrated Circuit Emphasis) simulations and user-generated marker layers or text points to check for electrical overstress, but this is an error-prone method because it requires the designer to manually determine how voltages propagate throughout the design, and manually mark the correct regions for high-voltage design rules. Markers are also extremely difficult to maintain as the design is changed and can miss errors due to lack of simulation coverage.

With consumer expectations for longer device operation at sustained performance levels, designing for reliability is no longer an optional product feature, but a necessary and integral part of a product's specifications. Designers need verification tools and techniques that go beyond the traditional triumvirate of design rule checking (DRC), layout vs. schematic (LVS) comparison, and electrical rule checking (ERC) to provide thorough detection of and protection against electrical overstress conditions.

BRIEF SUMMARY OF THE DISCLOSED TECHNOLOGY

Aspects of the disclosed technology relate to techniques of voltage-based reliability verification. In one aspect, there is a method comprising: determining voltage values on nets of a circuit design based on a combination of propagating voltage values across components of the circuit design and simulating one or more subcircuits, wherein the one or more subcircuits are identified based on circuit topology recognition; analyzing the propagated voltage values for detecting problems of the circuit design; and reporting the detected problems in the circuit design.

The one or more subcircuits may be identified based further on voltage propagation. The propagating voltage values may be performed across components of the circuit design except components of the one or more subcircuits. The circuit topology recognition may comprise design pattern matching, component tracing or both. The simulating may employ a SPICE (Simulation Program with Integrated Circuit Emphasis) simulation tool.

The propagating may be based on employing both global iterations and local iterations, wherein at least one of the global iterations comprises local iterations for a subcircuit of the circuit design. The local iterations suspend when voltage values on nets of the subcircuit are not changed from one local iteration to a next local iteration or one preset condition is met. The subcircuit may be identified based on the circuit topology recognition.

The detected problems in the circuit design may comprise electrical overstress, electrostatic discharge, or both. The reporting may comprise storing and/or displaying information of the detected problems.

In another aspect, there is one or more computer-readable media storing computer-executable instructions for causing one or more processors to perform the above method.

In still another aspect, there is a system, comprising: one or more processors, the one or more processors programmed to perform the above method.

Certain inventive aspects are set out in the accompanying independent and dependent claims. Features from the dependent claims may be combined with features of the independent claims and with features of other dependent claims as appropriate and not merely as explicitly set out in the claims.

Certain objects and advantages of various inventive aspects have been described herein above. Of course, it is to be understood that not necessarily all such objects or advantages may be achieved in accordance with any particular embodiment of the disclosed technology. Thus, for example, those skilled in the art will recognize that the disclosed technology may be embodied or carried out in a manner that achieves or optimizes one advantage or group of advantages as taught herein without necessarily achieving other objects or advantages as may be taught or suggested herein.

DETAILED DESCRIPTION OF THE DISCLOSED TECHNOLOGY

Figure 1:
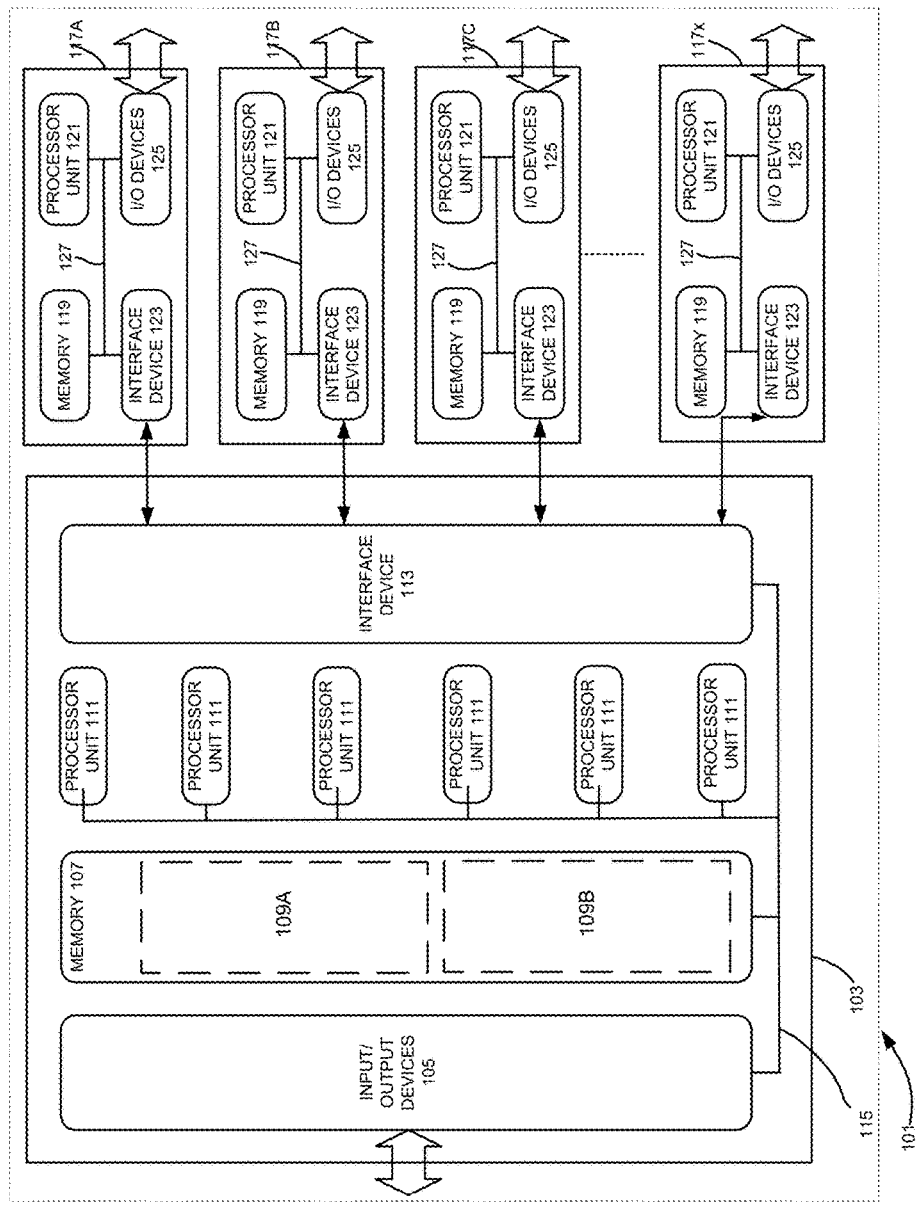
FIG. 1 illustrates an example of a computing system that may be used to implement various embodiments of the disclosed technology.

Various aspects of the present disclosed technology relate to techniques of voltage-based reliability verification. In the following description, numerous details are set forth for the purpose of explanation. However, one of ordinary skill in the art will realize that the disclosed technology may be practiced without the use of these specific details. In other instances, well-known features have not been described in detail to avoid obscuring the present disclosed technology.

Although the operations of some of the disclosed methods, apparatus, and systems are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods, apparatus, and systems can be used in conjunction with other methods, apparatus, and systems. Additionally, the description sometimes uses terms like "propagate", "analyze", and "determine" to describe the disclosed methods. These terms are high-level abstractions of the actual operations that are performed. The actual operations that correspond to these terms may vary depending on the particular implementation and are readily discernible by one of ordinary skill in the art.

Any of the disclosed techniques can be implemented in whole or in part by software comprising computer-executable instructions stored on computer-readable media. Such software can comprise, for example, an appropriate electronic design automation ("EDA") software tool. Such software can be executed on a single computer or on a networked computer (e.g., via the Internet, a wide-area network, a local-area network, a client-server network, or other such network). For clarity, only certain selected aspects of the software-based implementations are described. Other details that are well known in the art are omitted. For example, it should be understood that the disclosed technology is not limited to any specific computer language, program, or computer. For example, the disclosed technology can be implemented using any commercially available computer executing a program written in any commercially available or otherwise suitable language. Any of the disclosed methods can alternatively be implemented (partially or completely) in hardware (e.g., an ASIC, PLD, or SoC).

Any data produced from any of the disclosed methods (e.g., intermediate or final test patterns, test patterns values, or control data) can be stored on computer-readable media (e.g., tangible computer-readable media, such as one or more CDs, volatile memory components (such as DRAM or SRAM), or nonvolatile memory components (such as hard drives)) using a variety of different data structures or formats. Such data can be created, updated, or stored using a local computer or over a network (e.g., by a server computer).

As used in this disclosure, the singular forms "a," "an," and "the" include the plural forms unless the context clearly dictates otherwise. Additionally, the term "includes" means "comprises." Moreover, the term "design" is intended to encompass data describing an entire microdevice, such as an integrated circuit device or micro-electromechanical system (MEMS) device. This term also is intended to encompass a smaller group of data describing one or more components of an entire microdevice, however, such as a layer of an integrated circuit device, or even a portion of a layer of an integrated circuit device.

Still further, the term "design" also is intended to encompass data describing more than one microdevice, such as data to be used to create a mask or reticle for simultaneously forming multiple microdevices on a single wafer. The layout design data may be in any desired format, such as, for example, the Graphic Data System II (GDSII) data format or the Open Artwork System Interchange Standard (OASIS) data format proposed by Semiconductor Equipment and Materials International (SEMI). Other formats include an open source format named Open Access, Milkyway by Synopsys, Inc., and EDDM by Mentor Graphics, Inc.

Illustrative Operating Environment

The execution of various electronic design automation processes according to embodiments of the disclosed technology may be implemented using computer-executable software instructions executed by one or more programmable computing devices. Because these embodiments of the disclosed technology may be implemented using software instructions, the components and operation of a generic programmable computer system on which various embodiments of the disclosed technology may be employed will first be described. Further, because of the complexity of some electronic design automation processes and the large size of many circuit designs, various electronic design automation tools are configured to operate on a computing system capable of simultaneously running multiple processing threads. The components and operation of a computer network having a host or master computer and one or more remote or servant computers therefore will be described with reference to FIG. 1. This operating environment is only one example of a suitable operating environment, however, and is not intended to suggest any limitation as to the scope of use or functionality of the disclosed technology.

In FIG. 1, the computer network 101 includes a master computer 103. In the illustrated example, the master computer 103 is a multi-processor computer that includes a plurality of input and output devices 105 and a memory 107. The input and output devices 105 may include any device for receiving input data from or providing output data to a user.

The input devices may include, for example, a keyboard, microphone, scanner or pointing device for receiving input from a user. The output devices may then include a display monitor, speaker, printer or tactile feedback device. These devices and their connections are well known in the art, and thus will not be discussed at length here.

The memory 107 may similarly be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information.

As will be discussed in detail below, the master computer 103 runs a software application for performing one or more operations according to various examples of the disclosed technology. Accordingly, the memory 107 stores software instructions 109A that, when executed, will implement a software application for performing one or more operations. The memory 107 also stores data 109B to be used with the software application. In the illustrated embodiment, the data 109B contains process data that the software application uses to perform the operations, at least some of which may be parallel.

The master computer 103 also includes a plurality of processor units 111 and an interface device 113. The processor units 111 may be any type of processor device that can be programmed to execute the software instructions 109A, but will conventionally be a microprocessor device. For example, one or more of the processor units 111 may be a commercially generic programmable microprocessor, such as Intel® Pentium® or Xeon™ microprocessors, Advanced Micro Devices Athlon™ microprocessors or Motorola 68K/Coldfire® microprocessors. Alternately or additionally, one or more of the processor units 111 may be a custom-manufactured processor, such as a microprocessor designed to optimally perform specific types of mathematical operations. The interface device 113, the processor units 111, the memory 107 and the input/output devices 105 are connected together by a bus 115.

Figure 2:
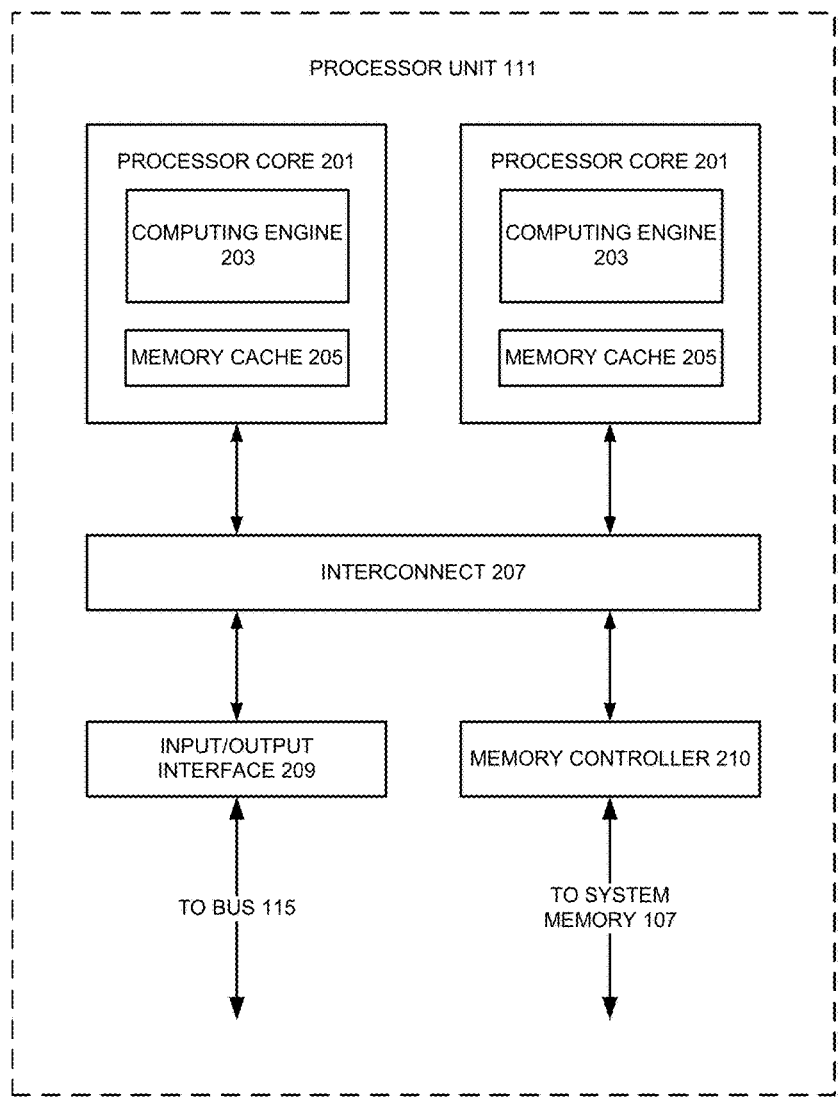
FIG. 2 illustrates an example of a multi-core processor unit that may be used to implement various embodiments of the disclosed technology.

With some implementations of the disclosed technology, the master computing device 103 may employ one or more processing units 111 having more than one processor core. Accordingly, FIG. 2 illustrates an example of a multi-core processor unit 111 that may be employed with various embodiments of the disclosed technology. As seen in this figure, the processor unit 111 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 111. With some processor cores 201, such as the Cell microprocessor created by Sony Corporation, Toshiba Corporation and IBM Corporation, the interconnect 207 may be implemented as an interconnect bus. With other processor units 111, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interface 209 and a memory controller 210. The input/output interface 209 provides a communication interface between the processor unit 111 and the bus 115. Similarly, the memory controller 210 controls the exchange of information between the processor unit 111 and the system memory 107. With some implementations of the disclosed technology, the processor units 111 may include additional components, such as a high-level cache memory shared by the processor cores 201.

While FIG. 2 shows one illustration of a processor unit 111 that may be employed by some embodiments of the disclosed technology, it should be appreciated that this illustration is representative only, and is not intended to be limiting. Also, with some implementations, a multi-core processor unit 111 can be used in lieu of multiple, separate processor units 111. For example, rather than employing six separate processor units 111, an alternate implementation of the disclosed technology may employ a single processor unit 111 having six cores, two multi-core processor units each having three cores, a multi-core processor unit 111 with four cores together with two separate single-core processor units 111, etc.

Returning now to FIG. 1, the interface device 113 allows the master computer 103 to communicate with the servant computers 117A, 117B, 117C . . . 117x through a communication interface. The communication interface may be any suitable type of interface including, for example, a conventional wired network connection or an optically transmissive wired network connection. The communication interface may also be a wireless connection, such as a wireless optical connection, a radio frequency connection, an infrared connection, or even an acoustic connection. The interface device 113 translates data and control signals from the master computer 103 and each of the servant computers 117 into network messages according to one or more communication protocols, such as the transmission control protocol (TCP), the user datagram protocol (UDP), and the Internet protocol (IP). These and other conventional communication protocols are well known in the art, and thus will not be discussed here in more detail.

Each servant computer 117 may include a memory 119, a processor unit 121, an interface device 123, and, optionally, one more input/output devices 125 connected together by a system bus 127. As with the master computer 103, the optional input/output devices 125 for the servant computers 117 may include any conventional input or output devices, such as keyboards, pointing devices, microphones, display monitors, speakers, and printers. Similarly, the processor units 121 may be any type of conventional or custom-manufactured programmable processor device. For example, one or more of the processor units 121 may be commercially generic programmable microprocessors, such as Intel® Pentium® or Xeon™ microprocessors, Advanced Micro Devices Athlon™ microprocessors or Motorola 68K/Coldfire® microprocessors. Alternately, one or more of the processor units 121 may be custom-manufactured processors, such as microprocessors designed to optimally perform specific types of mathematical operations. Still further, one or more of the processor units 121 may have more than one core, as described with reference to FIG. 2 above. For example, with some implementations of the disclosed technology, one or more of the processor units 121 may be a Cell processor. The memory 119 then may be implemented using any combination of the computer readable media discussed above. Like the interface device 113, the interface devices 123 allow the servant computers 117 to communicate with the master computer 103 over the communication interface.

In the illustrated example, the master computer 103 is a multi-processor unit computer with multiple processor units 111, while each servant computer 117 has a single processor unit 121. It should be noted, however, that alternate implementations of the disclosed technology may employ a master computer having single processor unit 111. Further, one or more of the servant computers 117 may have multiple processor units 121, depending upon their intended use, as previously discussed. Also, while only a single interface device 113 or 123 is illustrated for both the master computer 103 and the servant computers, it should be noted that, with alternate embodiments of the disclosed technology, either the computer 103, one or more of the servant computers 117, or some combination of both may use two or more different interface devices 113 or 123 for communicating over multiple communication interfaces.

With various examples of the disclosed technology, the master computer 103 may be connected to one or more external data storage devices. These external data storage devices may be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information. According to some implementations of the disclosed technology, one or more of the servant computers 117 may alternately or additionally be connected to one or more external data storage devices. Typically, these external data storage devices will include data storage devices that also are connected to the master computer 103, but they also may be different from any data storage devices accessible by the master computer 103.

It also should be appreciated that the description of the computer network illustrated in FIG. 1 and FIG. 2 is provided as an example only, and it not intended to suggest any limitation as to the scope of use or functionality of alternate embodiments of the disclosed technology.

Design Flow and Reliability Verification

Electronic circuits, such as integrated microcircuits, are used in a variety of products, from automobiles to microwaves to personal computers. Designing and fabricating integrated circuit devices typically involves many steps, sometimes referred to as a "design flow." The particular steps of a design flow often are dependent upon the type of integrated circuit, its complexity, the design team, and the integrated circuit fabricator or foundry that will manufacture the microcircuit. Typically, software and hardware "tools" verify the design at various stages of the design flow by running software simulators and/or hardware emulators. These steps aid in the discovery of errors in the design, and allow the designers and engineers to correct or otherwise improve the design.

Several steps are common to most design flows. Initially, the specification for a new circuit is transformed into a logical design, sometimes referred to as a register transfer level (RTL) description of the circuit. With this logical design, the circuit is described in terms of both the exchange of signals between hardware registers and the logical operations that are performed on those signals. The logical design typically employs a Hardware Design Language (HDL), such as the Very high speed integrated circuit Hardware Design Language (VHDL). The logic of the circuit is then analyzed, to confirm that it will accurately perform the functions desired for the circuit. This analysis is sometimes referred to as "functional verification."

After the accuracy of the logical design is confirmed, it is converted into a device design by synthesis software. The device design, which is typically in the form of a schematic or netlist, describes the specific electronic devices (such as transistors, resistors, and capacitors) that will be used in the circuit, along with their interconnections. This device design generally corresponds to the level of representation displayed in conventional circuit diagrams. The relationships between the electronic devices are then analyzed, to confirm that the circuit described by the device design will correctly perform the desired functions. This analysis is sometimes referred to as "formal verification." Additionally, preliminary timing estimates for portions of the circuit are often made at this stage, using an assumed characteristic speed for each device, and incorporated into the verification process.

Once the components and their interconnections are established, the design is again transformed, this time into a physical design that describes specific geometric elements. This type of design often is referred to as a "layout" design. The geometric elements, which typically are polygons, define the shapes that will be created in various layers of material to manufacture the circuit. Typically, a designer will select groups of geometric elements representing circuit device components (e.g., contacts, channels, gates, etc.) and place them in a design area. These groups of geometric elements may be custom designed, selected from a library of previously-created designs, or some combination of both. Lines are then routed between the geometric elements, which will form the wiring used to interconnect the electronic devices. Layout tools (often referred to as "place and route" tools), such as Mentor Graphics' IC Station or Cadence's Virtuoso, are commonly used for both of these tasks.

Integrated circuit layout descriptions can be provided in many different formats. The Graphic Data System II (GDSII) format is a popular format for transferring and archiving two-dimensional graphical IC layout data. Among other features, it contains a hierarchy of structures, each structure containing layout elements (e.g., polygons, paths or polylines, circles and textboxes). Other formats include an open source format named Open Access, Milkyway by Synopsys, Inc., EDDM by Mentor Graphics, Inc., and the more recent Open Artwork System Interchange Standard (OASIS) proposed by Semiconductor Equipment and Materials International (SEMI). These various industry formats are used to define the geometrical information in IC layout designs that are employed to manufacture integrated circuits. Once the microcircuit device design is finalized, the layout portion of the design can be used by fabrication tools to manufacture the device using a photolithographic process.

Process variations and technical limitations of the photolithography techniques can make it difficult or even impossible to print some layout features. To achieve a high overall yield and reliability for the design, the layout is measured by a set of geometric constraints, or design rules, specific to a particular photolithographic process before tapeout. Design rule checking is thus a major step during physical verification signoff on the design. Still further, the layout design may be modified to include the use of redundant geometric elements or the addition of corrective features to various geometric elements, to counteract limitations in the manufacturing process, etc. For example, the design flow process may include one or more resolution enhancement technique (RET) processes (e.g., optical proximity correction), that modify the layout design data to improve the usable resolution of the reticle or mask created from the design in a photolithographic manufacturing process.

Circuit designs and layout designs are also reviewed for reliability issues caused by the electrical system. This is sometimes referred to as reliability verification. Reliability verification can include reviewing the design for protection from electrostatic discharge (ESD) events, detecting electrical overstress (EOS) situations, performing voltage-aware design rule checking (VDRC), or the like. Tools that can detect electrical overstress situations and perform voltage-aware design rule checking, often do so in a two-stage process—performing voltage propagation through the design, for example, at the schematic-level, and then comparing particular circuits in the design and their corresponding propagated voltages to various electric rules or design rules. Since reliability verification is typically performed without design simulation, i.e., without an understanding of electrical performance of the devices in the design, the tools often propagate a common voltage throughout the design, perform rule checking based on that common voltage, and determine a presence of electrical violations.

Voltage propagation can be performed in a vectored mode (circuit input states provided), a vectorless mode (only power/ground rails provided), or a hybrid mode. In a vectorless mode, for example, transistors may be assumed to be turned on and voltage values are propagated directly across them. In some cases, voltage values can only be propagated across a transistor in one direction (e.g., only from one terminal connected directly to a power or ground rail). Nets connected to power supply or ground rails are a common example of break nets (i.e., nets to which voltage values are not propagated). A net is a conductor interconnecting two or more terminals of components of the circuit design. Other components like inductors or resistors may be treated as short connections while diodes and capacitors may be considered as open circuits. These rules may be set as default rules for vectorless voltage propagation. Users may provide rules for particular components of the circuit design. For example, users may specify that certain transistors should be assumed to be in an "off" state during the voltage propagation process.

Figure 3:
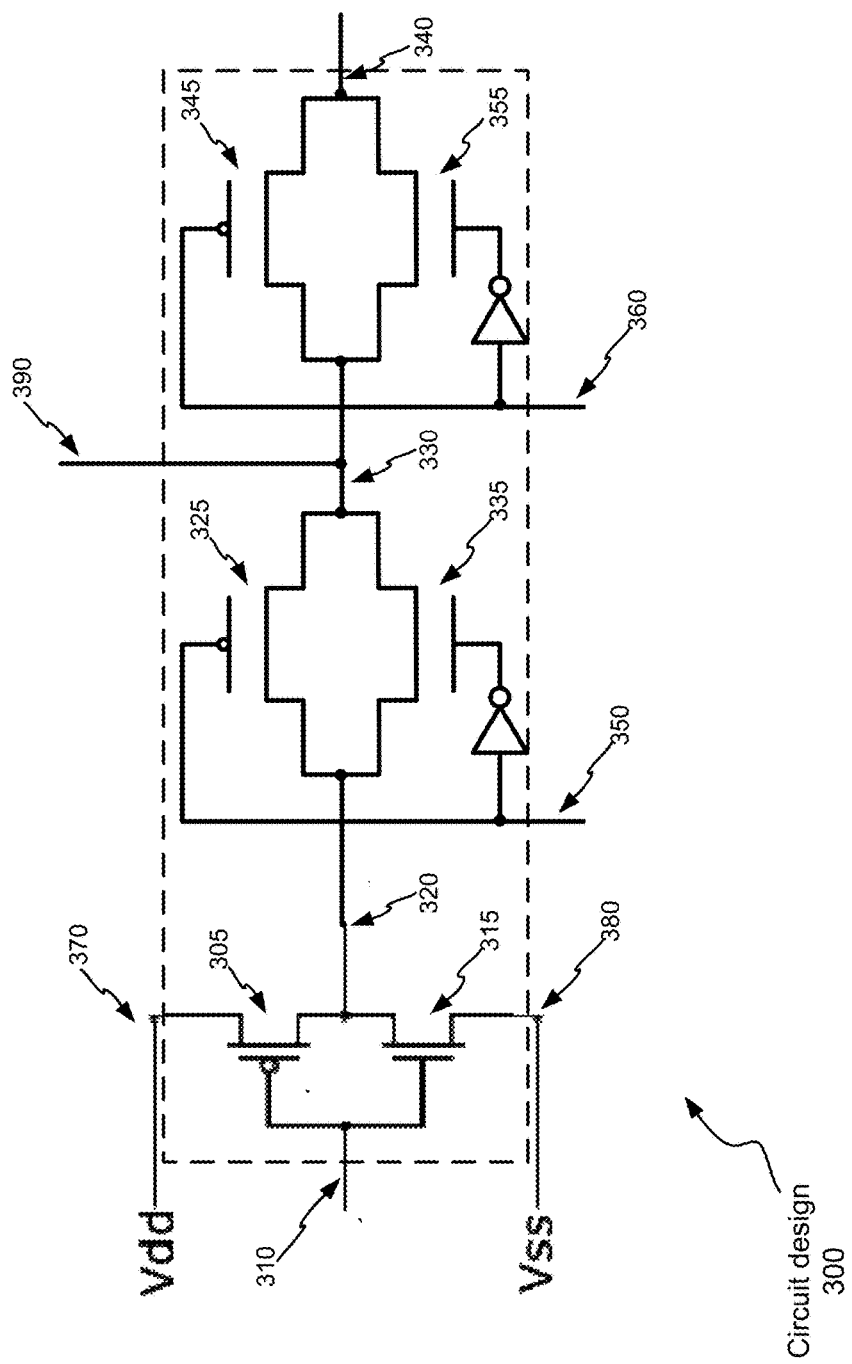
FIG. 3 shows an example of a circuit design 300 for illustrating how voltage propagation operates according to some embodiments of the disclosed technology.

A voltage propagation process typically comprises multiple iterations of voltage propagation before voltage values on nets of the circuit design become stable. Here, stable means unchanged from one iteration to the next iteration or that one preset condition is met. One example of the one preset condition may be a maximum number of the iterations being reached. FIG. 3 shows an example of a circuit design 300 for illustrating how the voltage propagation process is implemented according to some embodiments of the disclosed technology. The circuit design 300 includes an inverter and two transmission gates. The inverter includes two transistors 305 and 315; the first transmission gate includes two transistors 325 and 335; and the second transmission gate includes two transistors 345 and 355. Ports 310 and 340 are the input and output of the circuit design, respectively. Ports 370 and 380 are connected to the power supply and ground rails, respectively. Ports 350 and 360 are for control signal inputs of the two transmission gates, respectively.

If the transistors 305 and 315 connected to the power/ground rails are considered for voltage propagation first, voltage values on the net 320 will become known. If the transistors 325 and/or 335 are considered next, voltage values on the net 330 will become known. Finally, after the transistors 345 and/or 355 are considered, voltage values on the net 340 will become known. For this sequence, one iteration of voltage propagation is sufficient to assign voltage values to all of the nets, and the next iteration will not change any of the voltage values. It should be noted that at least two iterations are normally needed for a voltage propagation process because it will not terminate until voltage values on the nets become stable or a predefined condition is met. The former is decided by checking whether or not the voltage values change from one iteration to the next. The latter is usually satisfied after multiple iterations.

If either of the two transmission gates is considered first, however, at least two iterations of voltage propagation are needed to assign voltage values to all of the nets. For example, if the transistors 325 and 335 are considered first, voltage values on neither of the two nets 320 and 330 will be assigned. After all of the transistors are analyzed once, only voltage values on the net 320 become known. At least one more iteration is needed to propagate the voltage values on the net 320 to the nets 330 and 340. Therefore, voltage values on the nets are said to be unstable after one iteration because voltage values on some of the nets are changed (here, from unknown to known) from the first iteration to the second iteration.

Figure 4:
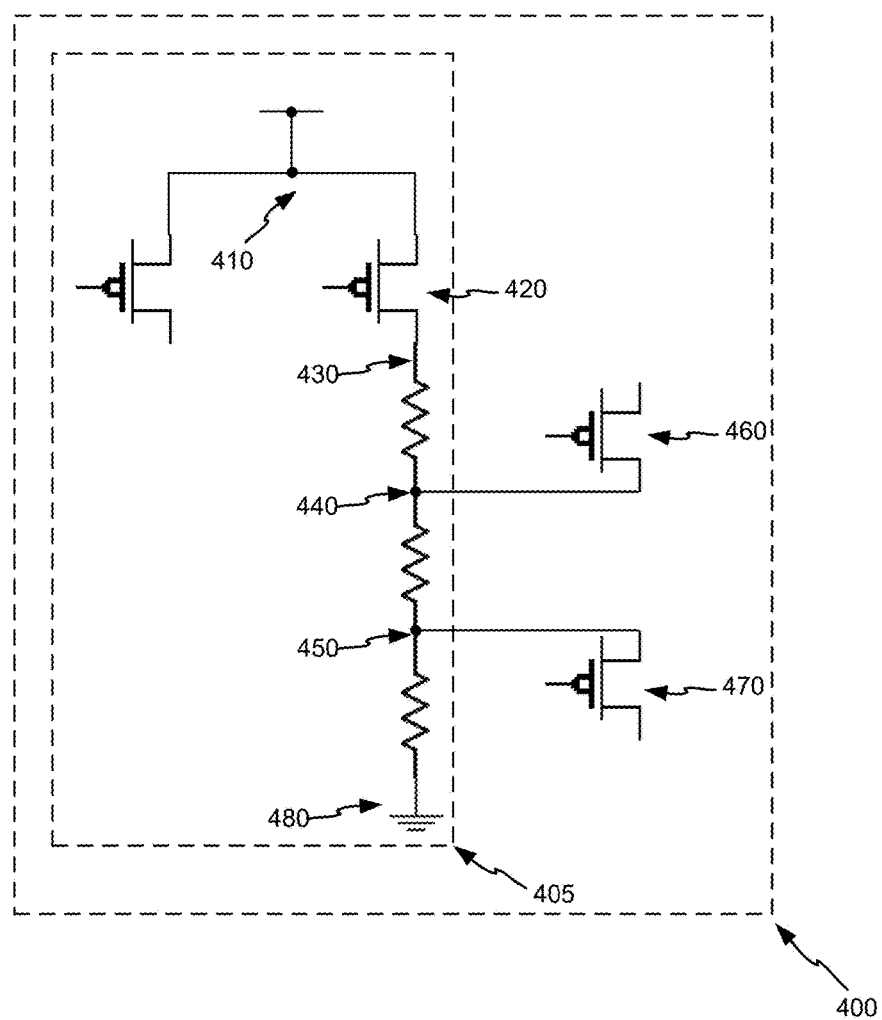
FIG. 4 illustrates an example about how false errors may be generated by a pure voltage propagation process.

Electrical violations in a circuit design identified based on voltage propagation alone may include false errors. FIG. 4 illustrates an example about how the false errors may be generated. A circuit design 400 shown in FIG. 4 includes a subcircuit of voltage regulator 405. The voltage regulator 405 drives two transistors 460 and 470. Design rules may specify that voltage value at the drain terminal of the transistor 460 must be less than or equal to 2.7 volts and that voltage value at the source terminal of the transistor 470 must be smaller than or equal to 1.8 volts. To check for rule violations, a voltage propagation process is performed on the circuit design 400.

The voltage regulator 405 includes a transistor 420. The source terminal of the transistor 420 is coupled to a power supple rail 410 (3.3 volts) and the drain terminal of the transistor 420 is coupled to a chain of resistors which is in turn coupled to a ground rail 480. As discussed previously, in a vectorless voltage propagation process, a transistor is assumed to be "on" and a resistor is treated as a short connector. Accordingly, voltage values at nets 430, 440 and 450 will be 3.3 volts after voltage propagation. The nets 440 and 450 are connected to the drain terminal of the transistor 460 and the source terminal of the transistor 470, respectively. Therefore, a reliability check based purely on voltage propagation may flag these two nets as sources for electrical overstress.

Both of the rule violations are false errors, however. This is because voltage values at the nets 440 and 450 will be smaller than 2.7 volts and 1.8 volts, respectively, if a simulation process is performed on the voltage regulator 405 and the three resistors have equal resistance values.

Another example of false errors generated by a pure voltage propagation process involves sequential elements such as flip-flops. In a vectored voltage propagation process, the gate terminal of a transistor connected to a flip-flop output may be identified as a floating gate. Electrically floating gates can lead to unpredictable current leakage. By performing simulation on the flip-flop circuit, the false floating gate problem can be removed from the rule violation report.

As can be seen from the above examples, combining localized simulations with voltage propagation can increase the accuracy of voltage-based reliability verification. This may be particularly useful for complex analog and mixed-signal circuits.

Reliability Verification Tool

Figure 5:
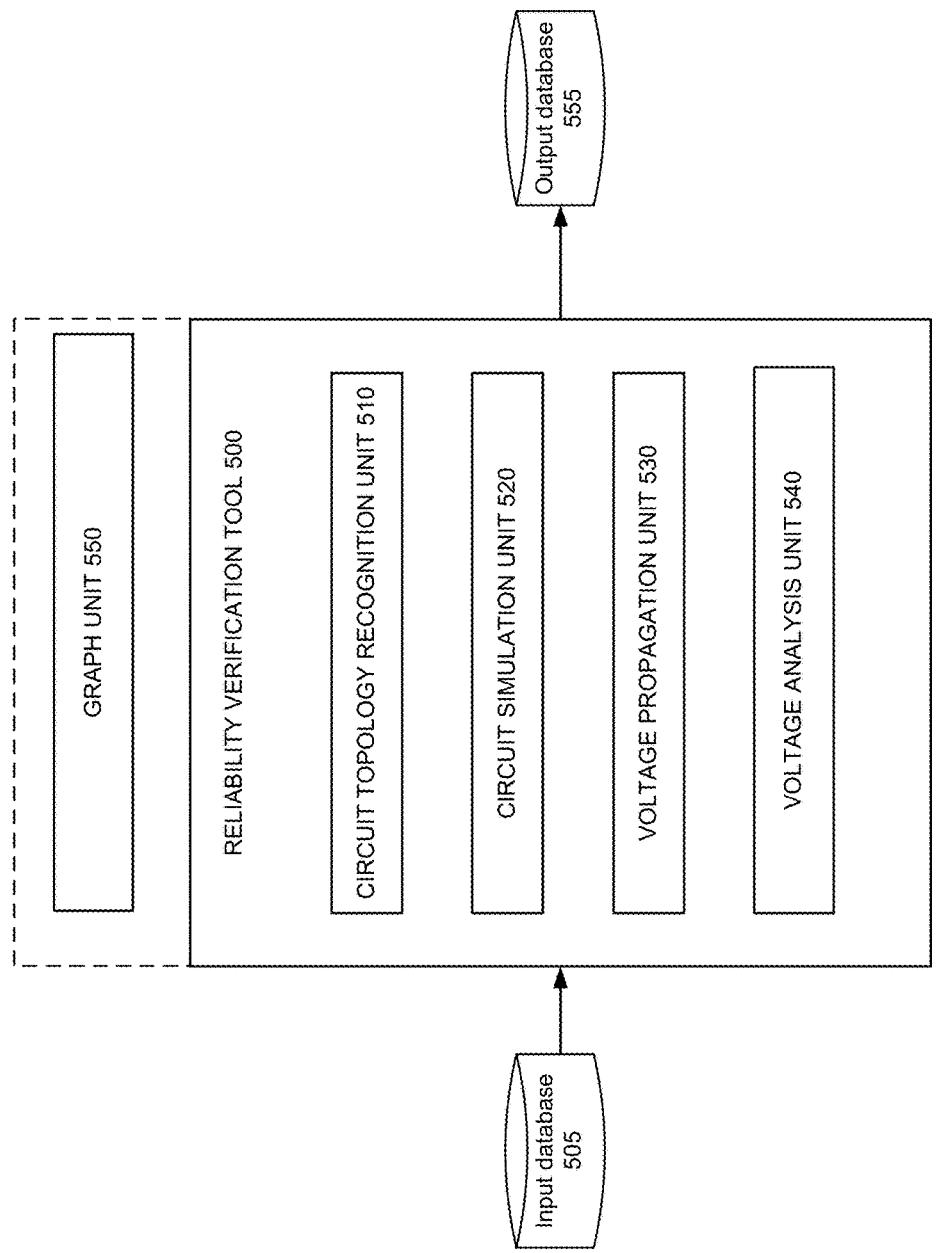
FIG. 5 illustrates an example of a reliability verification tool that may be implemented according to various embodiments of the disclosed technology.

FIG. 5 illustrates an example of a reliability verification tool 500 that may be implemented according to various embodiments of the disclosed technology. As seen in this figure, the reliability verification tool 500 includes a circuit topology recognition unit 510, a circuit simulation unit 520, a voltage propagation unit 530 and a voltage analysis unit 540. Some implementations of the reliability verification tool 500 may cooperate with (or incorporate) one or more of a graph unit 550, an input database 505 and an output database 555.

As will be discussed in more detail below, the reliability verification tool 500 can receive a circuit design from the input database 505. The circuit topology recognition unit 510, the circuit simulation unit 520, and the voltage propagation unit 530 work together to determine voltage values on nets of the circuit design. The voltage analysis unit 540 can analyze the determined voltage values to detect problems in the circuit design. The reliability verification tool 500 can report the detected problems in the circuit design. The reporting may comprise storing in the output database 555 and/or displaying by the graph unit 550, information about the detected problems.

As previously noted, various examples of the disclosed technology may be implemented by one or more computing systems, such as the computing system illustrated in FIGS. 1 and 2. Accordingly, one or more of the circuit topology recognition unit 510, the circuit simulation unit 520, the voltage propagation unit 530, the voltage analysis unit 540 and the graph unit 550 may be implemented by executing programming instructions on one or more processors in one or more computing systems, such as the computing system illustrated in FIGS. 1 and 2. Correspondingly, some other embodiments of the disclosed technology may be implemented by software instructions, stored on a non-transitory computer-readable medium, for instructing one or more programmable computers/computer systems to perform the functions of one or more of the circuit topology recognition unit 510, the circuit simulation unit 520, the voltage propagation unit 530, the voltage analysis unit 540 and the graph unit 550. As used herein, the term "non-transitory computer-readable medium" refers to computer-readable medium that are capable of storing data for future retrieval, and not propagating electro-magnetic waves. The non-transitory computer-readable medium may be, for example, a magnetic storage device, an optical storage device, or a solid state storage device.

It also should be appreciated that, while the circuit topology recognition unit 510, the circuit simulation unit 520, the voltage propagation unit 530, the voltage analysis unit 540 and the graph unit 550 are shown as separate units in FIG. 5, a single computer (or a single processor within a master computer) or a single computer system may be used to implement all of these units at different times, or components of these units at different times.

With various examples of the disclosed technology, the input database 505 and the output database 555 may be implemented using any suitable computer readable storage device. That is, either of the input database 505 and the output database 555 may be implemented using any combination of computer readable storage devices including, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable storage devices may also include magnetic cassettes, magnetic tapes, magnetic disks or other magnetic storage devices, holographic storage devices, or any other non-transitory storage medium that can be used to store desired information. While the input database 505 and the output database 555 are shown as separate units in FIG. 5, a single data storage medium may be used to implement some or all of these databases.

Hybrid Reliability Verification

Figure 6:
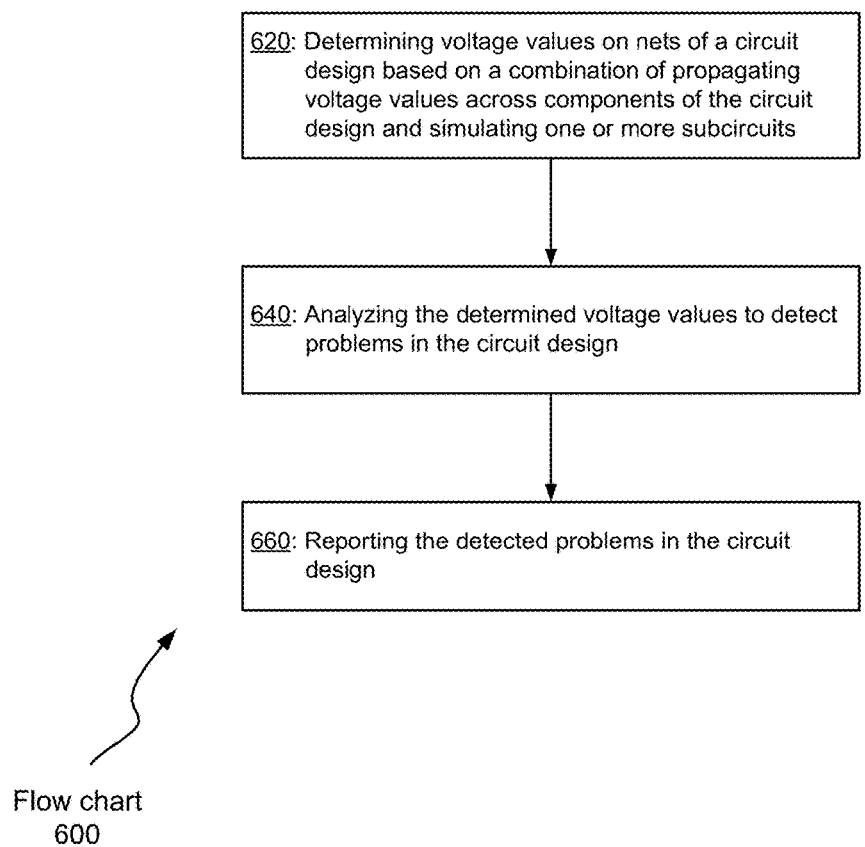
FIG. 6 illustrates a flowchart showing a process of voltage-based reliability verification that may be implemented according to various examples of the disclosed technology.

FIG. 6 illustrates a flowchart 600 showing a process of voltage-based reliability verification that may be implemented according to various examples of the disclosed technology. For ease of understanding, methods of reliability verification that may be employed according to various embodiments of the disclosed technology will be described with reference to the reliability verification tool 500 in FIG. 5 and the flow chart 600 illustrated in FIG. 6. It should be appreciated, however, that alternate implementations of a reliability verification tool 500 may be used to perform the methods of reliability verification illustrated by the flow chart 600 according to various embodiments of the disclosed technology. Likewise, the reliability verification tool 500 may be employed to perform other methods of reliability verification according to various embodiments of the disclosed technology.

In operation 620, the circuit topology recognition unit 510, the circuit simulation unit 520, and the voltage propagation unit 530 work together to determine voltage values on nets of a circuit design. The circuit design describes components, such as resistors, transistors, or the like, and the connectivity of those components in an electronic device. The circuit design can model the electronic device at a schematic-level, for example, in a netlist coded with a Simulation Program with Integrated Circuit Emphasis (SPICE) language, an Electronic Design Interchange Format (EDIF) language, or the like. In some embodiments, the reliability verification tool 500 can receive the circuit design from a source external to the reliability verification tool 500, such as a user interface of the computer network 101, another tool implemented by the computer network 101, or the reliability verification tool 500 may internally generate the circuit design.

Figure 7:
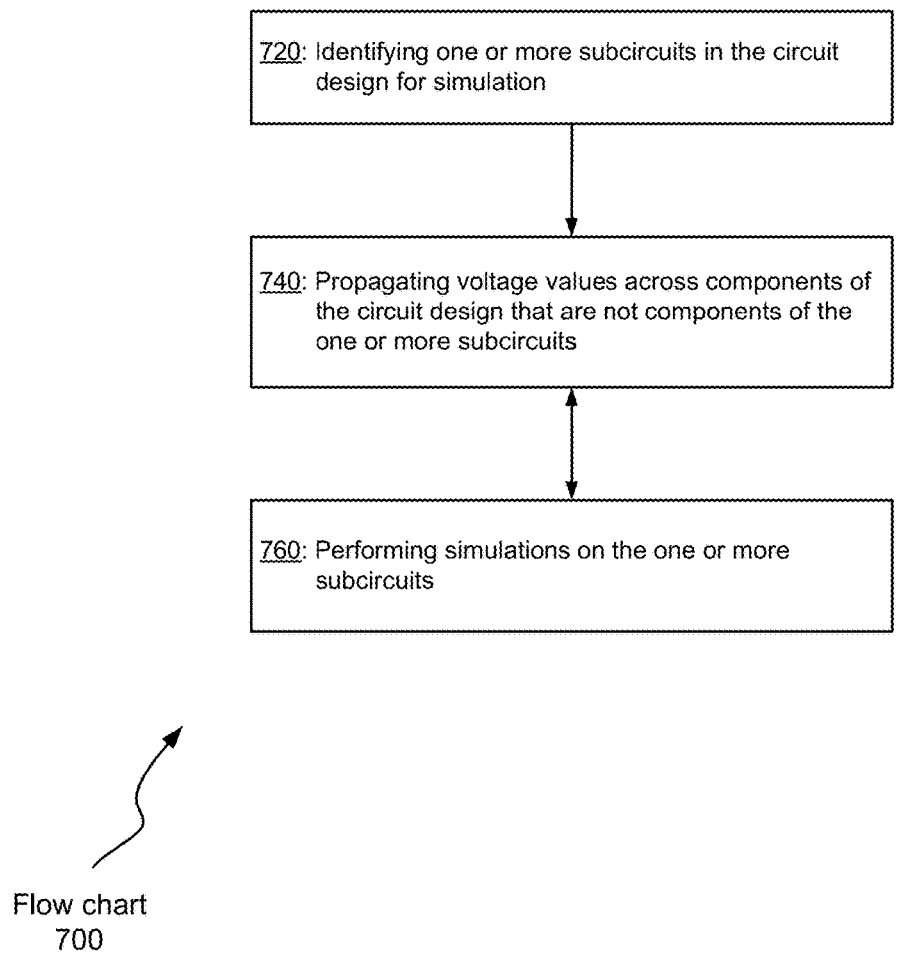
FIG. 7 illustrates a flowchart describing how to determine voltage values on nets of the circuit design according to some embodiments of the disclosed technology

FIG. 7 illustrates a flowchart 700 describing how the circuit topology recognition unit 510, the circuit simulation unit 520, and the voltage propagation unit 530 may work together to determine voltage values on nets of the circuit design according to some embodiments of the disclosed technology. In operation 720, the circuit topology recognition unit 510 identifies one or more subcircuits in the circuit design for simulation. The subcircuits may comprise voltage regulators, current mirrors, sequential circuit elements, and/or any user-defined circuitry. With various implementations of the disclosed technology, the circuit topology recognition unit 510 may identify the one or more subcircuits based on design pattern matching: comparing component patterns in the circuit design with design patterns that represent, for example, voltage regulators. Additionally or alternatively, the circuit topology recognition unit 510 may identify a subcircuit by tracing circuit components through the circuit design.

The circuit topology recognition unit 510 can access design patterns from a pattern library. The pattern library may be stored in the input database 505. The pattern library may include static patterns describing a preset circuit configuration, and/or include configurable patterns having definable parameters corresponding to an array of circuit configurations that can cover multiple different static patterns. For example, a static pattern of the voltage regulator 405 can define circuitry including three series-coupled resistors. A configurable pattern of a voltage regulator can be similar to the static pattern except that it can include one or more parameters to provide configuration variability. For example, the parameters in a configurable pattern can identify a range of circuit configurations, such as any number of multiple resistors coupled in series, which will all can correspond to a voltage regulator. This flexibility in defining patterns as configurable can save time and effort as compared to generating separate static patterns for every possible circuit configuration.

In operation 740 of the flow chart 700, the voltage propagation unit 530 propagates voltage values across components of the circuit design that are not components of the one or more subcircuits. In operation 760, the circuit simulation unit 520 performs simulations on the one or more subcircuits. A conventional SPICE (Simulation Program with Integrated Circuit Emphasis) simulation tool may be employed by the circuit simulation unit 520. Here, the operations 740 and 760 may be performed together. Voltage values propagated to input ports of the one or more subcircuits by the voltage propagation unit 530 may be used by the circuit simulation unit 520 to perform the simulations. Voltage values derived by the circuit simulation unit 520 for output ports of the one or more subcircuits may be propagated by the voltage propagation unit 530 to nets outside the one or more subcircuits.

Figure 8:
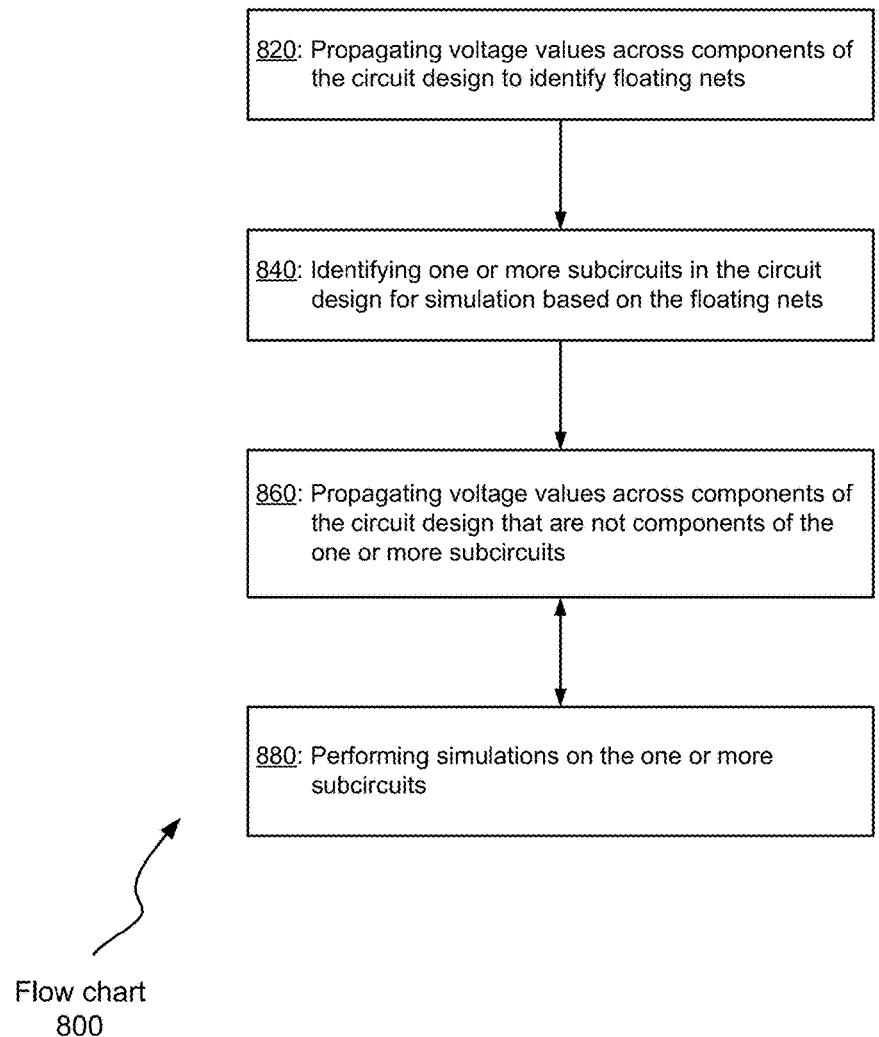
FIG. 8 illustrates a flowchart describing an alternative or additional approach about how to determine voltage values on nets of the circuit design.

FIG. 8 illustrates a flowchart 800 describing an alternative or additional approach about how the circuit topology recognition unit 510, the circuit simulation unit 520, and the voltage propagation unit 530 may work together to determine voltage values on nets of the circuit design. In operation 820, the voltage propagation unit 530 propagates voltage values across components of the circuit design. After voltage values become stable (i.e., unchanged from one iteration to the next one) or a predefined condition is met, voltage values for one or more nets may still be unknown. The one or more nets are referred to as floating nets (floating nodes). In a vectored voltage propagation process, for example, the voltage value at a net connecting an output of a flip-flop with the gate of a transistor may be undefined, resulting in a floating gate (floating net/node).

In operation 840, the circuit topology recognition unit 510 can identify one or more subcircuits in the circuit design for simulation based on the floating nets. In the above example, the flip-flop or a subcircuit including the flip-flop may be identified for simulation.

In operations 860 and 880 of the flowchart 800, like in the operations 740 and 760 of the flowchart 700, the voltage propagation unit 530 and the circuit simulation unit 520 perform voltage propagation and simulation, respectively, to determine final voltage values on nets of the circuit design.

To further speed up the voltage propagation process, the voltage propagation unit 530 may combine global iterations with local iterations. The global iteration concerns the circuit design while the local iteration concerns a subcircuit of the circuit design. The subcircuit for local iteration may also be identified by the circuit topology recognition unit 510. With various implementations of the disclosed technology, at least one of the global iterations comprises local iterations for a subcircuit of the circuit design, which suspends when voltage values on nets of the subcircuit are stable (i.e., voltage values on nets of the subcircuit are not changed from one local iteration to the next local iteration) or one preset condition is met.

Referring back to the circuit design 300 shown in FIG. 3, if the circuit design 300 is a subcircuit of a larger circuit design, voltage values will probably not be stable with respect to not only the larger circuit design but also the subcircuit 300 after one global iteration of voltage propagation without local iterations (all eligible components of the larger circuit design are considered once). With various implementations of the disclosed technology, the voltage propagation unit 530 will conduct iterations of voltage propagation for the subcircuit 300 (referred to as local iterations) within an iteration of voltage propagation for the larger circuit design (referred to as global iterations). The local iterations suspend when voltage values on nets of the subcircuit 300 become stable with respect to the present global iteration. In the next global iteration, the voltage propagation unit 530 may conduct the local iterations again. This is needed when, for example, one or more voltage values different from the ones derived from the previous local iterations appear at port 390 after the previous global iteration is completed.

While inserting local iterations into a global iteration may slow down the global iteration, the total number of the global iterations can be greatly reduced. As a result, the whole voltage propagation process will be accelerated. Some experiments have shown a reduction of processing time at least by half. In various embodiments, the reliability verification tool 500 may allow users to specify directly/indirectly on which subcircuits to conduct local iterations and/or in which global iterations to include local iterations.

The circuit design may be represented by a flat description or a hierarchical description. In the hierarchical description, the circuit design is viewed as a collection of component aggregates that are further divided into sub-aggregates in a recursive and hierarchical manner. These hierarchical units are commonly referred to as cells (or modules, blocks, macros, and so on); the use of a cell at a given level of hierarchy is called a cell instance. The use of a cell at some point in a circuit implies that the entire content of the cell's definition is present at that point in the final circuit. Multiple uses of a cell indicate that the cell contents are to be repeated at each use.

Figure 9:
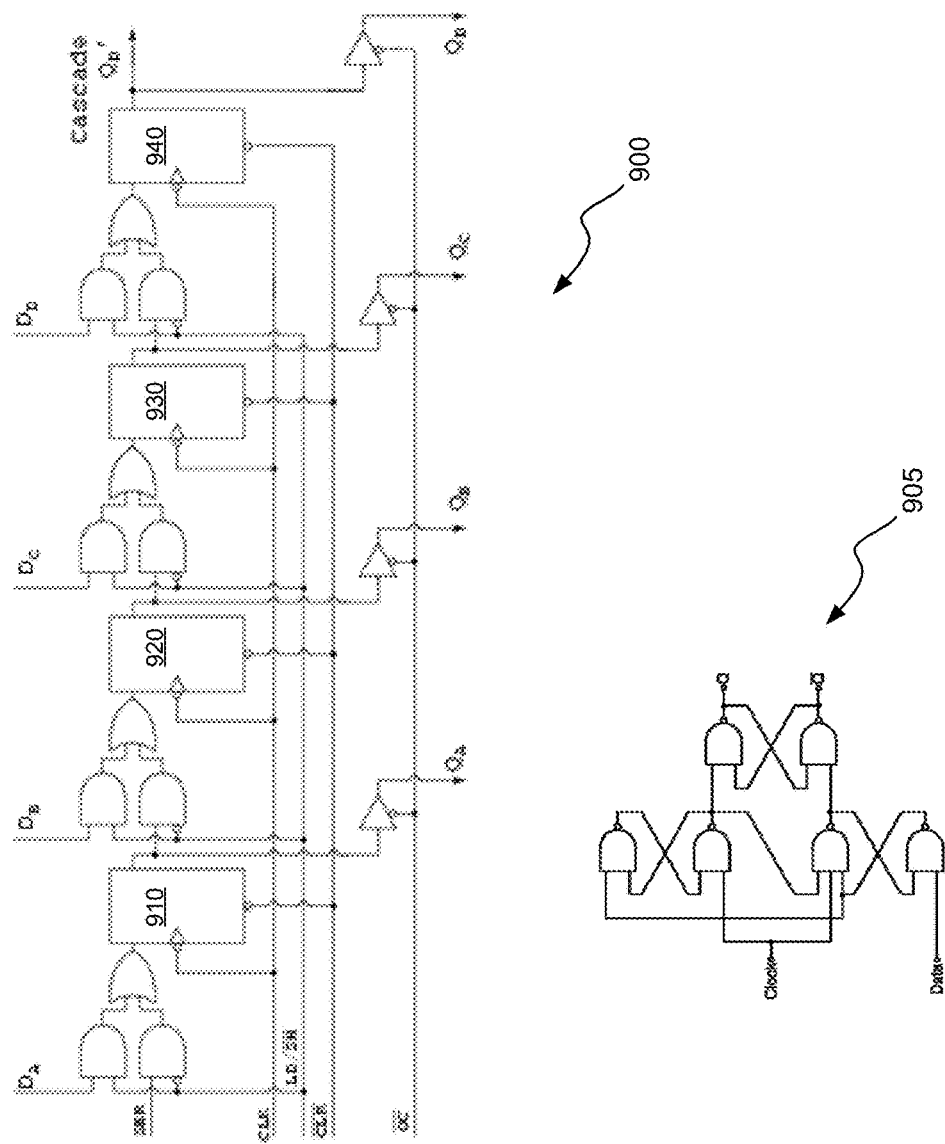
FIG. 9 illustrates an example of a shift register and an example of a flip-flop.
Figure 10:
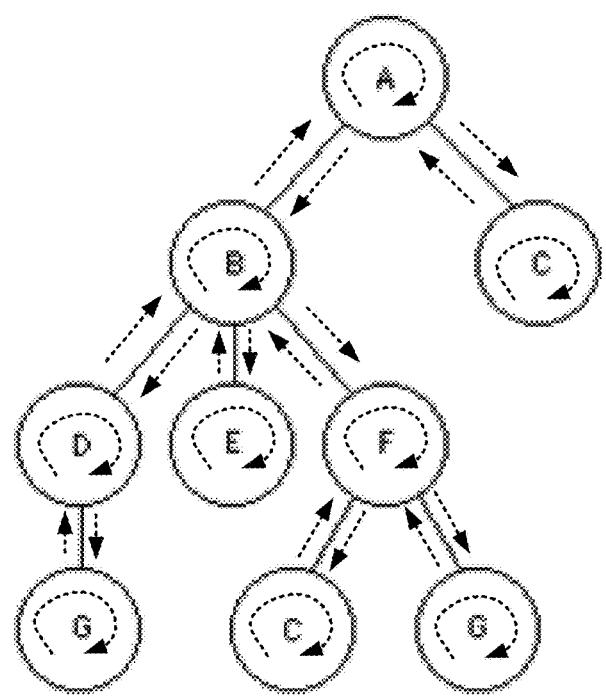
FIG. 10 illustrates an example of a hierarchical structure of a circuit design.
Figure 10:
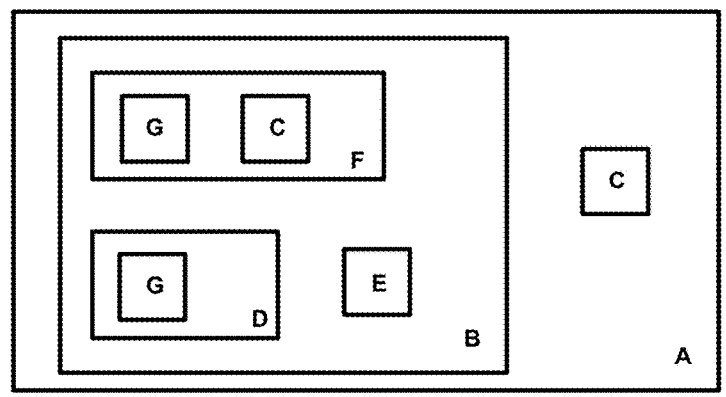

FIG. 9 illustrates an example of a shift register 900 and an example of a flip-flop 905. The shift register 900 contains a plurality of flip-flops (cells) 910-940 for storing bits of data and a plurality of AND and OR gates for controlling the mode of inputs: serial or parallel inputs. Each flip-flop contains various logical gates (cells) such as AND gates, as shown by the flip-flop 905. Each logical gate is formed mainly by transistors. Thus, multiple instances of the AND gate cell are present on two different levels of the hierarchy design of the shift register. The shift register may itself be a cell in a larger circuit design. FIG. 10 illustrates an example of a hierarchical structure of a circuit design. In the figure, cell A is the root cell, cells C, E and G are leaf cells, and cell B, D and F are composition cells.

The circuit design processed in the operation 620 may use a hierarchical description. The global iterations performed by the voltage propagation unit 530 may comprise propagating voltage values up and down the circuit hierarchy. The subcircuits for which the local iterations are performed by the voltage propagation unit 530 may comprise the root cell, one or more of the composition cells, one or more of the leaf cells, or some combinations thereof.

One major reason for using a hierarchical description is to hide the vast amount of detail in a circuit design. By reducing the distracting detail to a single object that is lower in the hierarchy, one can greatly simplify many circuit design/verification operations. The voltage propagation unit 530 may propagate voltage values in a cell for one or more local iterations until voltage values on the nets of the cell become stable (i.e., voltage values on the nets of the cell are not changed from one iteration to the next iteration) or one preset condition is met and then apply the result to instances of the cell that have the same voltage values at the power supply and input ports.

FIG. 10 also illustrates how global and local iterations may be performed according to some embodiments of the disclosed technology. The curved dash lines with arrows represent local iterations while the straight dash lines with arrows represent global iterations. Each of the global iterations includes a propagation up the design hierarchy (illustrated by straight dash lines with arrows upwards) and a propagation down the design hierarchy (illustrated by straight dash lines with arrows downwards). In the propagation up the design hierarchy, the individual cells perform their own local iterations until voltage values on nets within the individual cells are stable. In the propagation down the design hierarchy, voltage values on nets in the cells that are connected to cell input ports are updated with voltage values at the cell input ports.

In operation 660 of the flow chart 600, the voltage analysis unit 540 analyzes the determined voltage values to detect problems in the circuit design. In some embodiments, the voltage analysis unit 540 compares the propagated voltages and the corresponding components against various electrical or design rules. For example, the voltage analysis unit 540 can determine whether a component, such as a thin-film transistor, receives a voltage in excess of its rating capacity, whether certain components are located within always-on voltage nets, whether the circuit design provides adequate spacing between nets with different voltage values, or the like. Additionally or alternatively, the voltage analysis unit 540 may determine whether the circuit design provides adequate spacing between nets with different voltage values by performing a latch-up check, a dielectric breakdown test, or the like.

The voltage analysis unit 540 may also utilize an indication of whether different voltages are synchronized when determining whether the circuit design includes any electrical violations based on the propagated voltages. For example, one type of electrical violation check can compare a minimum voltage of one net versus a maximum voltage of another net, and vice versa, to identify what layout spacing should be between the two nets. When the two nets have a synchronous voltage, however, the analysis by the voltage analysis unit 540 can correspond to a comparison of minimum voltages for the two different nets and a comparison of maximum voltages for the two different nets, which should reduce inaccurate identifications of electrical violations.

Besides finding problems in the layout design, the voltage analysis may help reduce layout spacing requirements for two neighboring features if the voltage differences are relatively low.

In operation 660 of the flowchart 600, the reliability verification tool 500 reports the detected problems in the circuit design. The reporting may comprise storing and/or displaying information of the detected problems. The reliability verification tool 500 (or the graph unit 550) may annotate the graphical representation of the circuit design with indications of electrical violations, for example, which can identify a location of the electrical violations, the corresponding rule prompting the electrical violation, or the like. In some embodiments, the graph unit 550 may display the annotated graphical representation of the circuit design on a display device.

Conclusion

Having illustrated and described the principles of the disclosed technology, it will be apparent to those skilled in the art that the disclosed embodiments can be modified in arrangement and detail without departing from such principles. In view of the many possible embodiments to which the principles of the disclosed technologies can be applied, it should be recognized that the illustrated embodiments are only preferred examples of the technologies and should not be taken as limiting the scope of the disclosed technology. Rather, the scope of the disclosed technology is defined by the following claims and their equivalents. We therefore claim as our disclosed technology all that comes within the scope and spirit of these claims.

What is claimed is:

1. One or more computer-readable media storing computer-executable instructions for causing one or more processors to perform a method, the method comprising:
   determining voltage values on nets of a circuit design based on a combination of propagating voltage values across components of the circuit design and simulating one or more subcircuits, wherein:
   the one or more subcircuits are identified based on circuit topology recognition,
   the propagating is based on performing global iterations of the entire circuit design in combination with performing local iterations of the one or more subcircuits,
   at least one of the global iterations comprises performing local iterations for one of the one or more subcircuits of the circuit design while voltage values on nets of the subcircuit are unstable with respect to the at least one of the global iterations, and suspending performing the local iterations for the one of the one or more subcircuits of the circuit design when the voltage values on the nets of the subcircuit become stable with respect to the at least one of the global iterations;
   analyzing the determined voltage values to detect problems in the circuit design; and
   reporting the detected problems in the circuit design, wherein the reported detected problems are thereafter used in a design automation process to correct the circuit design, and the corrected circuit design is usable for manufacturing a device using a photolithographic process.

2. The one or more computer-readable media recited in claim 1, wherein the propagating voltage values is performed across components of the circuit design except components of the one or more subcircuits.

3. The one or more computer-readable media recited in claim 1, wherein the circuit topology recognition comprises design pattern matching, component tracing or both.

4. The one or more computer-readable media recited in claim 1, wherein the one or more subcircuits are identified based further on voltage propagation.

5. The one or more computer-readable media recited in claim 1, wherein the simulating employs a SPICE (Simulation Program with Integrated Circuit Emphasis) simulation tool.

6. The one or more computer-readable media recited in claim 1, wherein the problems in the circuit design comprise electrical overstress, electrostatic discharge, or both.

7. The one or more computer-readable media recited in claim 1, wherein the reporting comprises storing and/or displaying information of the detected problems.

8. A method, executed by at least one processor of a computer, comprising:
   determining voltage values on nets of a circuit design based on a combination of propagating voltage values across components of the circuit design and simulating one or more subcircuits, wherein:
      the one or more subcircuits are identified based on circuit topology recognition,
      the propagating is based on performing global iterations of the entire circuit design in combination with performing local iterations of the one or more subcircuits, and
      at least one of the global iterations comprises performing local iterations for one of the one or more subcircuits of the circuit design while voltage values on nets of the subcircuit are unstable with respect to the at least one of the global iterations, and suspending performing the local iterations for the one of the one or more subcircuits of the circuit design when the voltage values on the nets of the subcircuit become stable with respect to the at least one of the global iterations;
   analyzing the determined voltage values to detect problems in the circuit design; and
   reporting the detected problems in the circuit design, wherein the reported detected problems are thereafter used in a design automation process to correct the circuit design, and the corrected circuit design is usable for manufacturing a device using a photolithographic process.

9. The method recited in claim 8, wherein the propagating voltage values is performed across components of the circuit design except components of the one or more subcircuits.

10. The method recited in claim 8, wherein the circuit topology recognition comprises design pattern matching, component tracing or both.

11. The method recited in claim 8, wherein the one or more subcircuits are identified based further on voltage propagation.

12. The method recited in claim 8, wherein the simulating employs a SPICE (Simulation Program with Integrated Circuit Emphasis) simulation tool.

13. The method recited in claim 8, wherein the problems in the circuit design comprise electrical overstress, electrostatic discharge, or both.

14. The method recited in claim 8, wherein the reporting comprises storing and/or displaying information of the detected problems.

15. A system comprising:
   one or more processors, the one or more processors programmed to perform a method, the method comprising:
   determining voltage values on nets of a circuit design based on a combination of propagating voltage values across components of the circuit design and simulating one or more subcircuits, wherein:
      the one or more subcircuits are identified based on circuit topology recognition,
      the propagating is based on performing global iterations of the entire circuit design in combination with performing local iterations of the one or more subcircuits, and
      at least one of the global iterations comprises performing local iterations for one of the one or more subcircuits of the circuit design while voltage values on nets of the subcircuit are unstable with respect to the at least one of the global iterations, and suspending performing the local iterations for the one of the one or more subcircuits of the circuit design when the voltage values on the nets of the subcircuit become stable with respect to the at least one of the global iterations;
   analyzing the determined voltage values to detect problems in the circuit design; and
   reporting the detected problems in the circuit design, wherein the reported detected problems are thereafter used in a design automation process to correct the circuit design, and the corrected circuit design is usable for manufacturing a device using a photolithographic process.

16. The system recited in claim 15, wherein the propagating voltage values is performed across components of the circuit design except components of the one or more subcircuits.

17. The system recited in claim 15, wherein the circuit topology recognition comprises design pattern matching, component tracing or both.

18. The system recited in claim 15, wherein the one or more subcircuits are identified based further on voltage propagation.

\* \* \* \* \*